US010056306B2

(12) United States Patent
Cooney, III et al.

(10) Patent No.: US 10,056,306 B2
(45) Date of Patent: Aug. 21, 2018

(54) TEST STRUCTURE FOR MONITORING INTERFACE DELAMINATION

(71) Applicant: GLOBALFOUNDRIES INC., Grand Cayman, KY (US)

(72) Inventors: Edward C. Cooney, III, Jericho, VT (US); Gary L. Milo, Milton, VT (US); Thomas W. Weeks, Hyde Park, VT (US); Patrick S. Spinney, Charlotte, VT (US); John C. Hall, Essex Junction, VT (US); Brian P. Conchieri, Essex, VT (US); Brett T. Cucci, Essex Junction, VT (US); Thomas C. Lee, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 115 days.

(21) Appl. No.: 15/015,478

(22) Filed: Feb. 4, 2016

(65) Prior Publication Data
US 2017/0229358 A1    Aug. 10, 2017

(51) Int. Cl.
*H01L 21/66* (2006.01)
*H01L 23/544* (2006.01)
*G01R 31/28* (2006.01)

(52) U.S. Cl.
CPC .......... *H01L 22/32* (2013.01); *G01R 31/2853* (2013.01); *G01R 31/2884* (2013.01); *H01L 23/544* (2013.01)

(58) Field of Classification Search
CPC ... H01L 22/32; H01L 23/544; G01R 31/2853; G01R 31/2884
See application file for complete search history.

(56) References Cited

U.S. PATENT DOCUMENTS

| | | | | |
|---|---|---|---|---|
| 2009/0127674 A1* | 5/2009 | Suzuki | ................ | H01L 23/04 257/659 |
| 2010/0253380 A1* | 10/2010 | Martin | ................ | H01L 22/34 324/762.01 |
| 2012/0261787 A1* | 10/2012 | Stamper | ................ | H01L 27/01 257/506 |
| 2016/0133531 A1* | 5/2016 | Yi | ................ | H01L 22/34 257/48 |

\* cited by examiner

*Primary Examiner* — David M Gray
*Assistant Examiner* — Michael Harrison
(74) *Attorney, Agent, or Firm* — David Cain; Hoffman Warnick LLC

(57) ABSTRACT

Aspects of the present disclosure include a test structure that includes two or more devices. Each device includes a wire disposed within a dielectric and a first via disposed over the wire and in electrical contact with the wire. Each device includes a test pad electrically connected to the first via and a polysilicon resistor electrically connected to the wire. Each of the polysilicon resistors of the two or more devices are electrically tied together. A method for forming the interconnect structure to be used for testing is also provided.

20 Claims, 2 Drawing Sheets

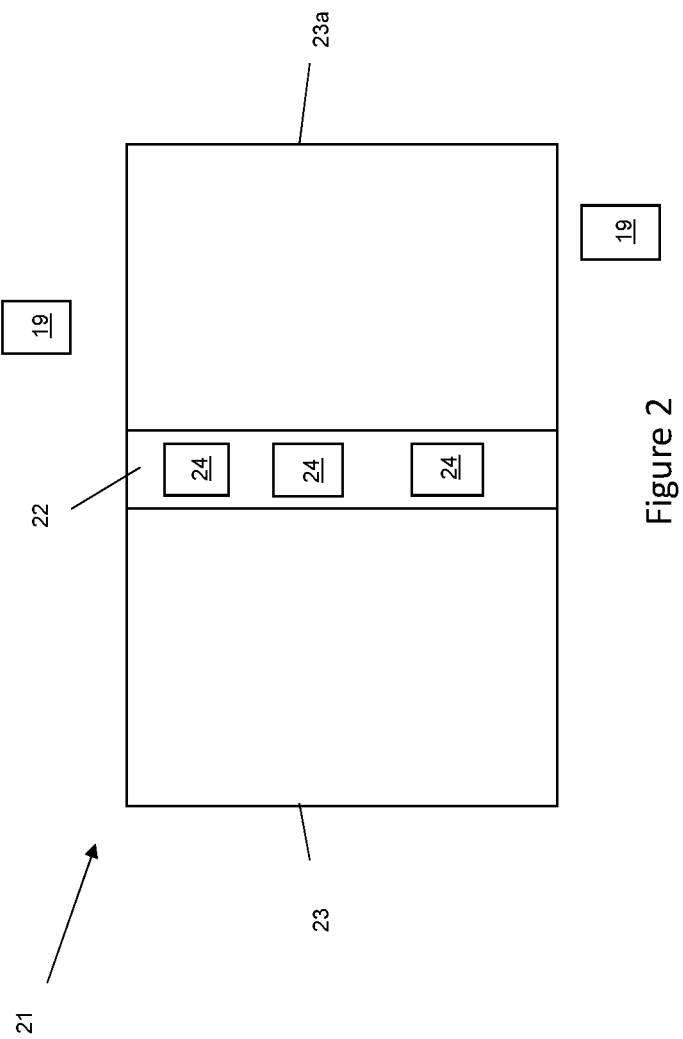

TEST STRUCTURE FOR MONITORING INTERFACE DELAMINATION

FIELD OF THE INVENTION

The subject matter disclosed herein relates to integrated circuit (IC) and devices for monitoring failures during the manufacturing process. More specifically, aspects of the disclosure relate to interconnect structures for determining whether there are problems during the manufacture of semiconductor wafers.

BACKGROUND

Integrated circuit (IC) chips are formed by fabricating a plurality of devices on a wafer, and dicing the wafer along kerf lines separating the devices, to form a plurality of individual chips. However, it is not practical to test each IC chip on a wafer to ensure the IC chip meets specification. When a manufacturing problem arises many shipments of wafers can occur wherein the ICs on the wafer do not meet specification.

BRIEF SUMMARY

A first embodiment of the present disclosure provides a test structure that includes two or more devices. Each device includes a wire disposed within a dielectric and a first via disposed over the wire and in electrical contact with the wire. Each device includes a test pad electrically connected to the first via and a polysilicon resistor electrically connected to the wire. Each of the polysilicon resistors of the two or more devices are electrically tied together.

A second embodiment of the present disclosure provides a method of testing an integrated circuit (IC) structure. The method includes providing a test structure that includes two or more devices. Each device includes a wire disposed within a dielectric and a first via disposed over the wire and in electrical contact with the wire. Each device includes a test pad electrically connected to the first via. Each device includes a polysilicon resistor electrically connected to the wire wherein the polysilicon resistors of the two or more devices are electrically tied together. The method includes providing a voltage or current to one of the test pads to determine whether there is an open circuit between the two or more devices.

A third embodiment of the present disclosure provides a test structure including two or more devices. Each device includes a copper wire disposed within a dielectric. Each device include a first tungsten via disposed over the wire and in electrical contact with the wire. Each device has a test pad electrically connected to the first via. Each device has a second tungsten via disposed under the wire and over the polysilicon resistor and in electrical contact with the wire and the polysilicon resistor. The second via is offset from the first via by at least 0.5 microns. Each device has a polysilicon resistor electrically connected to the wire wherein the polysilicon resistors of the two or more interconnect structures are electrically tied together.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which:

FIG. 2 shows a highly schematic representation of test structure described herein implemented in a kerf of a wafer.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
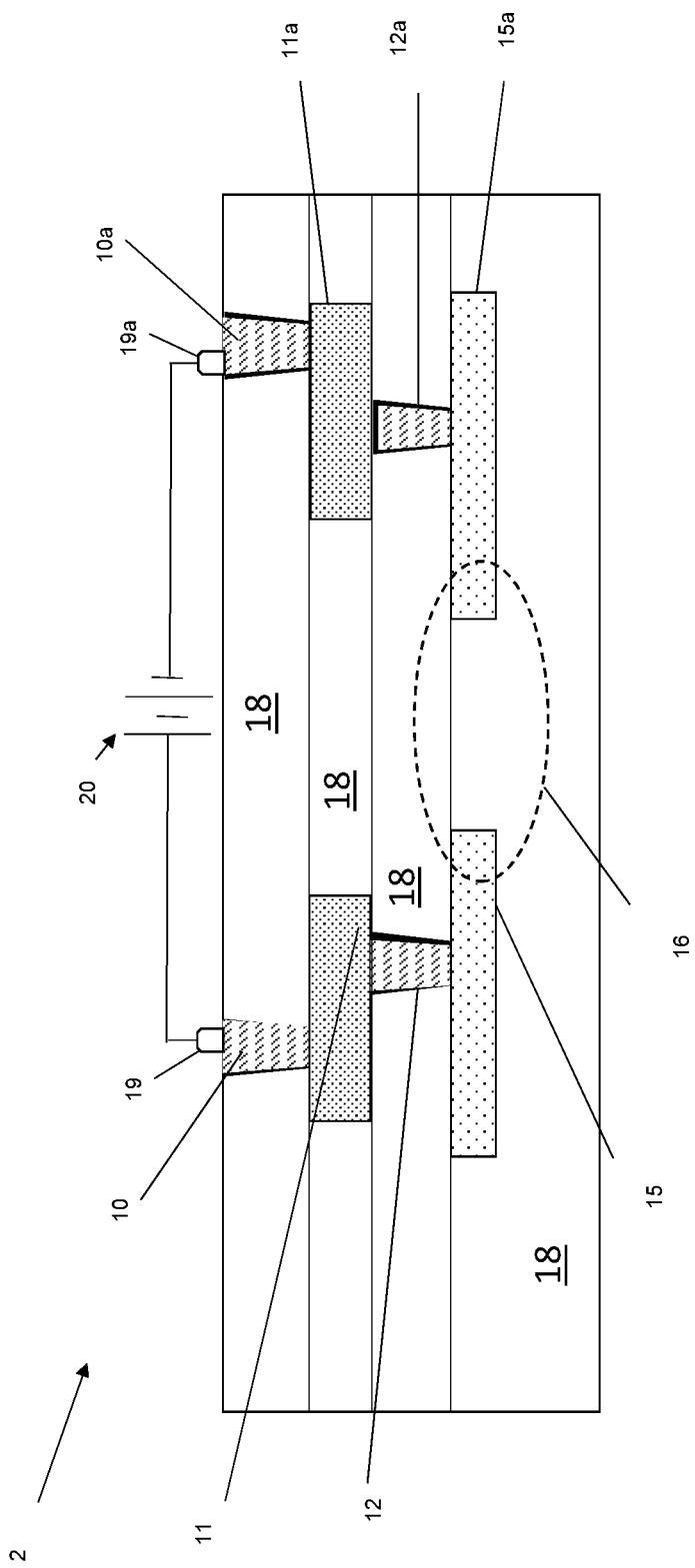
FIG. 1 shows a cross-sectional view of a portion of a test structure according to an embodiment or the present disclosure.

The disclosure will now be described by reference to the accompanying figures. In the figures, various aspects of the structures have been shown and schematically represented in a simplified manner to more clearly describe and illustrate the disclosure. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the disclosure is not limited to constructions of any particular shape.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present disclosure.

Embodiments of the present disclosure provide an interconnect structure for an integrated circuit (IC) structure having a plurality of devices thereon. Each device includes a first via disposed over the wire and in electrical contact with the wire of a local interconnect layer. Below the wire is a polysilicon resistor in electrical contact with the wire. In embodiments a second via may be disposed between the polysilicon resistor and the wire to provide electrical contact there between. Each of the devices is in electrical contact with an adjacent IC structure through the polysilicon resistors. A test pad is connected to the first via of one of the devices, and another test pad is connected to an adjacent device. This completes a circuit so when a voltage or current is provided to one of the test pads a determination is made as to whether there is electrical continuity or a failure of electrical contact between a first via and a wire in one of the devices. If there is no electrical continuity, an electrical disconnect between the first via and the wire has occurred and no current can flow. Therefore, at least one of the IC structures has an open electrical interconnect. The IC structure disclosed herein provides a testing method to ensure successful manufacturing.

Referring to FIG. 1 a cross-sectional view of a structure 2 used for testing the manufacturing reliability of an IC is shown. FIG. 1 shows a back of the line structure that allows one to detect failure between a via and a wire during manufacturing. Structure 2 shows one or more dielectric layers 18 into which the components described below are inserted. Structure 2 includes a first via 10 disposed above a first wire 11 in electrical contact therewith. In embodiments, a second via 12 is disposed below the first wire 11 and is in electrical contact therewith. Below second via 12 is a polysilicon resistor 15. Polysilicon resistor 15 is electrically tied to a polysilicon resistor of an adjacent polysilicon resistor 15a. The dashed oval 16 indicates that polysilicon resistors 15 and 15a are electrically tied to each other. The adjacent polysilicon resistor 15a is electrically connected to a third via 12a disposed below a second wire 11a. A via 10a is disposed above wire second 11a and in electrical contact therewith. By connecting via 10 to a first test pad 19 and via 10a to a second test pad 19a a circuit can be completed. By providing a voltage source 20, current can be measured to determine if the circuit is open. Typically there are two test pads connected to each end of the structure or chain of structures. That way one pad at each end can be used to force a voltage and the second can be used to measure a current flow. In embodiments, the structure may have one test pad at each end of the structure or chain and to merely measure the resistance of the chain, and if a nominal resistance is found (few to probably 100 ohms) there is electrical continuity versus an electrically open structure as denoted by excessively high resistance.

Although not shown, the structure shown in FIG. 1 is typically located upon a substrate. The substrate may comprise a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present application also contemplates cases in which the semiconductor substrate is a layered semiconductor such as, for example, Si/SiGe, Si/SiC, silicon-on-insulators (SOIs) or silicon germanium-on-insulators (SGOIs).

Structure 2, as depicted in FIG. 1, can be the result of metal formation processes, e.g., patterning, removal, deposition, etc., pursuant to photolithography techniques. Structure 2 can include one or more dielectric layers 18 which may be formed of any suitable dielectric material, although low-k dielectric materials are preferred. Suitable dielectric materials include carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). For this embodiment, preferred dielectric materials are organic polymeric thermoset materials, consisting essentially of carbon, oxygen and hydrogen. Preferred dielectric materials include the low-k polyarylene ether polymeric material known as SiLK™ (available from The Dow Chemical Company), and the low-k polymeric material known as FLARE™ (available from Honeywell).

Vias 10, 10a, 12 and 12a and wires 11 and 11a can be formed by selective etching and deposition. A dielectric layer 18 can be lithographically patterned and etched to form a wire trenches and via trenches prior to deposition of the metal of the via or wire known as damascene and which commonly uses subsequent copper fill and planarization. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the typically mid-UV or deep-UV light radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example. etching generally refers to the removal of material from a substrate (or structures formed on the substrate), and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features.

After etching, the via or wire is filled by application of a selective metal deposition process. Selective metal deposition generally refers to a process by which metal particles are formed or grown on some portions of an IC structure without being formed on or otherwise affecting other portions. A selective metal deposition can provide a mechanism by which, e.g., metals are formed on other metals or conductive structures without being formed on insulative materials.

An example of a selective metal deposition process can include, e.g., selective area chemical vapor deposition (SACVD), in which a film of material (e.g., a metal) is deposited in selected areas of an IC structure only. The selectivity of the deposition can be controlled by the chemical composition of the surface and the materials being deposited, e.g., by bond formation or cohesion being possible on metal surfaces but not on the surface of insulator materials such as oxides. To form vias 10, 10a, 12 and 12a or wires 11 and 11a by way of selective metal deposition, vias 10, 10a, 12 and 12a or wires 11 and 11a can be formed by depositing a conductive metal, in a single-step SACVD and/or plating process. The vias 10, 10a, 12 and 12a or wires 11 and 11a can be conductive metals such as tungsten (W), copper (Cu), aluminum (Al), silver (Ag), etc.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Diffusion barrier liners (not shown) may be deposited to prevent diffusion of the wire or via material. Diffusion barrier liners may include but are not limited to ruthenium; however, other refractory metals such as refractory metal compounds such as a tantalum nitride (TaN) and/or tantalum (Ta), conformally upon sidewalls of each wire opening. In addition or alternatively to TaN and/or Ta, liners can be composed of other metals such as cobalt (Co), manganese (Mn), titanium (Ti), tungsten (W), ruthenium (Ru), iridium (Ir), rhodium (Rh) and platinum (Pt), etc., or mixtures of thereof (e.g., alloys), or mixtures of thereof, may also be employed.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both subsurface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, cell phone or other input device, and a central processor.

Test structure 2 described herein can be disposed along a kerf of a wafer. This allows one to test the manufacturing process in an area of the wafer that is not used to produce product. The kerf of a wafer is typically 50 microns to 100 microns wide and can be used for embedding test structures that are destroyed when the wafer is diced to provide individual chips.

FIG. 2 shows a highly schematic representation of a test structures according to embodiments disclosed herein. More specifically, FIG. 2 shows a wafer 21 having a kerf 22 between a first chip 23 and a second chip 23a. FIG. 2 further shows devices 24 implemented in the kerf 10. A device 24 includes, the first via, first wire, second via and polysilicon resistor. The devices 24 can be coupled to one another by with test pads 19 and 19a when monitoring of the manufacturing process is desired. One or many structures can be electrically linked together to increase the number of vias being tested; that is one pair of structures to hundreds or even thousands. Test pads would be placed at the ends of all such structure groups.

EXAMPLES

During manufacture of the devices having a polysilicon resistor under a via, a wire and a second via, an unacceptably high number of the devices showed an electrical disconnect between via and wire. It was theorized that the cause of the problem was the offset nature of the underlying and overtop vias (W) and the high stresses imparted by via deposition process landing on the wire. An attempt to replicate the problem was devised by creating a series of repeating devices or macro of repeating devices similar to that shown in FIG. 1. The macro; however, substituted a wire of aluminum formed using substractive etching as also typically practiced in the semiconductor industry for the polysilicon resistors to electrically connect the devices. The macro was not able to reproduce the problem. This experiment indicated that the polysilicon resistors were required to replicate the problem. A second macro was created as shown in FIG. 1 and the problem was replicated.

It was also shown in further experiments that offsetting vias 10 and 15 in a device by one half of the diameter of the via opening or approximately 0.5 microns provided better replication on the problem.

In the interconnect structure disclosed herein, the vias 10, 12, 10a and 12a have a height of at least 2 microns. In embodiments the height of the vias is at least 4 microns. In the test structure disclosed herein, the wires 11 and 11a have a height of at least 1 micron. In embodiments the height of the wires is at least 3 microns. The via diameters are nominally 1 micron but can be 0.5 to 2 microns. The metal wire 18 formed of Copper using the damascene process described earlier can be 0.5 microns to 10 microns wide or greater, and is typically 1.5 microns wide.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A test structure comprising:
    two or more devices, wherein each device includes:
        a wire disposed within a dielectric;
        a first via disposed over the wire and in electrical contact with the wire;
        a second via disposed under the wire and over a polysilicon resistor and in electrical contact with the wire and the polysilicon resistor;
        a test pad electrically connected to the first via; and
        the polysilicon resistor electrically connected to the wire,
    wherein each of the polysilicon resistors of the two or more devices are electrically tied together.

2. The test structure of claim 1, wherein the first via and the second via of each device are offset by at least 0.5 microns.

3. The test structure of claim 1, wherein the second via of each device has a height of at least 2 microns.

4. The test structure of claim 1, wherein the first via of each device is selected from the group consisting of tungsten (W), copper (Cu), aluminum (Al), and silver (Ag).

5. The test structure of claim 1, wherein the second via of each device is selected from the group consisting of tungsten (W), copper (Cu), aluminum (Al), and silver (Ag).

6. The test structure of claim 1, wherein a wire of each device is selected from the group consisting of tungsten (W), copper (Cu), aluminum (Al), and silver (Ag).

7. The test structure of claim 1, wherein the test structure is disposed within a kerf of a wafer.

8. The test structure of claim 1, wherein the first via of each device has a height of at least 2 microns.

9. The test structure of claim 1, wherein the wire of each device has a height of at least 2 microns.

10. The test structure of claim 2, wherein the test structure is disposed within a kerf of a wafer.

11. The test structure of claim 3, wherein the test structure is disposed within a kerf of a wafer.

12. The test structure of claim 1, wherein: the first via of each device is selected from the group consisting of tungsten (W), copper (Cu), aluminum (Al), and silver (Ag); the second via of each device is selected from the group consisting of tungsten (W), copper (Cu), aluminum (Al), and silver (Ag); and wherein the wire is selected from the group consisting of tungsten (W), copper (Cu), aluminum (Al), and silver (Ag).

13. The test structure of claim 12, wherein the test structure is disposed within a kerf of a wafer.

14. The test structure of claim 1, wherein the first via and the second via of each device has a height of at least 2 microns.

15. The test structure of claim 14, wherein the test structure is disposed within a kerf of a wafer.

16. The test structure of claim 2, wherein: the first via of each device is selected from the group consisting of tungsten (W), copper (Cu), aluminum (Al), and silver (Ag); the second via of each device is selected from the group consisting of tungsten (W), copper (Cu), aluminum (Al), and silver (Ag); and wherein the wire is selected from the group consisting of tungsten (W), copper (Cu), aluminum (Al), and silver (Ag).

17. The test structure of claim 16, wherein the test structure is disposed within a kerf of a wafer.

18. The test structure of claim 2, wherein the first via and the second via of each device has a height of at least 2 microns.

19. The test structure of claim 18, wherein the test structure is disposed within a kerf of a wafer.

20. A test structure comprising:
    two or more devices disposed within a kerf of a wafer, wherein each device includes:
        a wire selected from the group consisting of tungsten (W), copper (Cu), aluminum (Al), and silver (Ag) having a height of at least 2 microns disposed within a dielectric;
        a first via having a height of at least 2 microns selected from the group consisting of tungsten (W), copper (Cu), aluminum (Al), and silver (Ag) disposed over the wire and in electrical contact with the wire;
        a second via having a height of at least 2 microns selected from the group consisting of tungsten (W), copper (Cu), aluminum (Al), and silver (Ag) disposed under the wire and over the polysilicon resistor and in electrical contact with the wire and the polysilicon resistor, wherein the first via and the second via on a device are offset by at least 0.5 microns;
        a test pad electrically connected to the first via; and
        a polysilicon resistor electrically connected to the wire,
    wherein each of the polysilicon resistors of the two or more devices are electrically tied together.

* * * * *